United States Patent [19]

Ishimura et al.

[11] Patent Number: 5,321,658
[45] Date of Patent: Jun. 14, 1994

[54] SEMICONDUCTOR MEMORY DEVICE BEING COUPLED BY AUXILIARY POWER LINES TO A MAIN POWER LINE

[75] Inventors: Tamihiro Ishimura; Masahumi Miyawaki; Yoshio Ohtsuki, all of Tokyo, Japan

[73] Assignee: Oki Electric Industry Co., Ltd., Tokyo, Japan

[21] Appl. No.: 702,496

[22] Filed: May 20, 1991

[30] Foreign Application Priority Data

May 31, 1990 [JP] Japan .................................. 2-142666
Jun. 15, 1990 [JP] Japan .................................. 2-155037

[51] Int. Cl.[5] .......................................... G11C 5/14
[52] U.S. Cl. .................................... 365/206; 365/226
[58] Field of Search .............. 365/63, 72, 204, 206, 365/194, 226

[56] References Cited

U.S. PATENT DOCUMENTS

| | | | |
|---|---|---|---|
| 3,621,302 | 11/1971 | Pricer ................................ | 307/291 |
| 4,539,659 | 9/1985 | Dumont ............................ | 365/226 |
| 5,173,873 | 12/1992 | Komatsu et al. ................ | 365/226 X |

FOREIGN PATENT DOCUMENTS

| | | |
|---|---|---|
| 0175880 | 4/1986 | European Pat. Off. . |
| 0318094 | 5/1989 | European Pat. Off. . |
| 0413590 | 2/1991 | European Pat. Off. . |
| 140586 | 7/1985 | Japan .................................. 365/226 |
| 62-195787 | 8/1987 | Japan . |
| 2021825 | 12/1979 | United Kingdom . |

OTHER PUBLICATIONS

Ananomyous Author; "Method For Equalizing Chip Power Flow"; Reproduced from *Research Disclosure*; Apr. 1986, No. 264.

*Primary Examiner*—Benny Lee
*Attorney, Agent, or Firm*—Spencer, Frank & Schneider

[57] ABSTRACT

In semiconductor memory device having a plurality of memory cell arrays in which a potential difference between a pair of bit lines to which memory cells are connected is amplified by a sense amplifier operating responsive to a sense latch signal on a common node, and the memory cells are connected via a power supply line to a power supply, the adverse effects due to the resistance of the power supply line is eliminated or reduced. This is achieved by coupling a power supply auxiliary line disposed within each memory cell array and a power supply main line disposed along the memory cell arrays by means of a resistive element having a resistance larger than the resistance of the power supply main line from the power supply to the memory cell array located farthest. Alternatively, the common node in each memory cell array is connected to said power supply main line via a resistive element and a sense amplifier drive transistor which is turned on and off by a control signal. Still alternatively, the transistors which are turned on by a control signal to connect the sense amplifiers to a power supply main line have a different mutual conductance depending on the resistance of the power supply line.

4 Claims, 15 Drawing Sheets

ARRAY 80₁ OPERATING

ARRAY 80ₙ OPERATING

SEMICONDUCTOR MEMORY DEVICE BEING COUPLED BY AUXILIARY POWER LINES TO A MAIN POWER LINE

FIELD OF THE INVENTION

The present invention relates to a semiconductor memory device, such as a dynamic random-access memory (RAM). The invention aims at reducing the difference in the operation margin between the memory cell arrays due to the line resistance (impedance) of the power supply line, and noises due to charging and discharging currents during the operation of the sense amplifier.

BACKGROUND OF THE INVENTION

An example of prior art semiconductor memory device of this type is shown in FIG. 1. Its configuration will now be described with reference to the drawings.

FIG. 1 shows the structure of the prior art semiconductor memory device, e.g., dynamic RAM.

This semiconductor memory device has a power supply pad 1 for the ground potential (Vss), and a power supply pad 2 for the power supply potential (Vcc). Connected to the Vss and Vcc power supply pads 1 and 2 are power supply lines 3 and 4. Connected between the power supply lines 3 and 4, respective are a plurality of memory cell arrays 10-1 to 10-N. The number of the memory cell arrays 10-1 to 10-N is 8, for example, in the case of a 4 Mbit dynamic RAM. Both supply lines 3 and 4 include line resistance r.

Each of the memory cell arrays 10-1 to 10-N comprises a memory cell matrix 10a of 512 Kbits, for example, a sense amplifier group 10b, and a control circuit 10c for controlling the sense amplifiers 10b. Although not illustrated, peripheral circuits, such as an input circuit for inputting a signal from the outside of the chip, an output circuit for outputting information of the memory cell to the outside, and a writing circuit for writing data from the outside into the memory cells are also connected to the Vss pad 1 and the Vcc pad 2.

In this semiconductor memory device, when a power supply voltage is supplied from the Vss pad 1 and the Vcc pad 2, the power supply voltage is applied via the power supply lines 3 and 4 to the memory cell arrays 10-1 to 10-N. Then the memory cell arrays 10-1 to 10-N operate, and accessing, i.e., data reading or data writing, is performed.

In this type of the semiconductor memory device, as the memory capacity is increased, e.g., up to several Mbits, the length of the conductor of the power supply lines (wiring conductors) 3 and 4 may be as long as several tens of millimeters, and the line resistance of the power supply lines 3 and 4 can be no longer neglected. The power supply lines 3 and 4 disposed from the Vss pad 1 and the Vcc pad 2 and along the memory cell arrays 10-1 to 10-N are therefore formed of a material having a low sheet resistance (such as aluminum) and their width is enlarged in order to reduce the resistance from the Vss pad 1 and the Vcc pad 2.

A specific example of a semiconductor memory device is shown in FIG. 2, and an example of the memory cell array in FIG. 2 is shown in FIG. 3. Identically labelled elements appearing in the different Figures refer to one in the same element.

As illustrated in FIG. 2, a plurality of memory cell arrays 10-1 to 10-N are connected between the power supply line 3 connected to the Vss pad 1 and the power supply line 4 connected to the Vcc pad 2. The sense amplifiers in each memory cell array 10-1 to 10-N are connected to the power supply line 3 via common nodes N1 supplying a sense latch signal SLN and sense amplifier drive n-channel MOS transistors (NMOS transistors) 11-1 to 11-N that are turned on and off by a control signal SN. The sense amplifiers in each memory cell array 10-1 to 10-N are connected to the power supply line 4 via common nodes N2 supplying a sense latch signal SLP and sense amplifier drive p-channel MOS transistors (PMOS transistors) 12-1 to 12-N which are turned on and off by a control signal SP.

Also connected to the Vss pad 1 and the Vcc pad 2 are a plurality of peripheral circuits 13-1 to 13-4 for controlling input and output of the semiconductor memory device.

The memory cell arrays 10-1 to 10-N are identical to each other, and one of them, the memory cell array 10-1 is taken up for further explanation with reference to FIG. 3.

The memory cell array 10-1 comprises a memory cell matrix $10a$, a sense amplifier group $10b$ comprising a plurality of sense amplifiers $10b_1$ to $10b_P$ and a control circuit $10c$. The control circuit $10c$ comprises a plurality of word line drive circuits $30_1$ to $30_Q$, precharge circuits $31_1$ to $31_P$, transfer gates $32_1$ to $32_P$, and the like.

The memory cell matrix $10a$ comprises a plurality of word lines $WL_1$ to $WL_Q$, and a plurality of pairs of bit lines $BL_1$, $\overline{BL}_1$ to $BL_P$, $\overline{BL}_P$, and memory cells $20_{11}$ to $20_{PQ}$ connected at the intersections of the word lines and the bit lines. Each memory cell $20_{11}$–$20_{PQ}$ includes a transistor $20a$ and a capacitor $20b$. Connected to the bit line pairs $BL_1$, $\overline{BL}_1$ to $BL_P$, $\overline{BL}_P$ are sense amplifiers $10b_1$ to $10b_P$. The sense amplifiers $10b_1$ to $10b_P$ are activated by the sense latch signals SLN and SLP on the common nodes N1 and N2, respectively, to detect and amplify the potential difference between each pair of bit lines, and is formed of two NMOS transistors $21a$ and $21b$, and two PMOS transistors $21c$ and $21d$.

The word line drive circuits $30_1$ to $30_Q$ are connected to the word lines $WL_1$ to $WL_Q$. The word line drive circuits $30_1$ to $30_Q$ respectively are responsive to the row decode selection signals $XD_1$ to $XD_Q$ to vary the word lines $WL_1$ to $WL_Q$ to the high level (Vcc) or to the low level (Vss). The precharge circuits $31_1$ to $31_P$ are connected to the pairs of bit lines $BL_1$, $\overline{BL}_1$ to $BL_P$, $\overline{BL}_P$ for precharging the corresponding pairs of the bit lines to a reference voltage VR responsive to a precharge signal EQ. The transfer gates $32_1$ to $32_P$ are connected to the pairs of bit lines $BL_1$, $\overline{BL}_1$ to $BL_P$, $\overline{BL}_P$ and are turned on and off by a column decode selection signal $YD_1$ to $YD_P$ to transfer data on the corresponding pairs of bit lines to complementary data lines DB and $\overline{DB}$.

FIG. 4 is a waveform diagram for explaining the operation of the circuit of FIG. 3. The operation of FIG. 2 and FIG. 3 will now be described with reference to FIG. 4.

Let us consider the operation of reading data "1" that is stored in the memory cell $20_{11}$ in FIG. 3.

In FIG. 4, the precharge signal EQ of the precharge circuits $31_1$ and $31_P$ precharging the pairs of bit lines $BL_1$, $\overline{BL}_1$ to $BL_P$, $\overline{BL}_P$ to the reference voltage VR ($=\frac{1}{2}\cdot Vcc$) is lowered from the high level ("H") to the low level to put an end to the precharge. Then, the word line $WL_1$ is raised to the high level by the word line drive circuit $30_1$ to which the column decode select signal $XD_1$ is input. Then the data "1" in the memory cell $20_{11}$ is output to the bit line $BL_1$, creating a slight potential difference between the pair of bit lines $BL_1$, $\overline{BL}_1$.

After the word line $WL_1$ is raised, the control signal SN is raised to the high level and the control signal SP is lowered to the low level. The sense amplifier drive NMOS transistor 11-1 and PMOS transistor 12-1 are turned on, and the sense latch signals SLN and SLP on the common nodes N1 and N2 precharged to the reference voltage VR, through a path not illustrated, are varied to the Vss level and the Vcc level, respectively, so that the sense amplifiers $10b_1$ to $10b_p$ operate. When the sense amplifiers $10b_1$ to $10b_p$ operate, a discharging current $I_1$ (see FIG. 3) flows from the bit line $\overline{BL}_1$ as well as other bit lines $\overline{BL}_2$ to $\overline{BL}_p$, via the NMOS transistors $21a$ of the respective sense amplifiers $10b_1$ to $10b_p$, the common node N1, and the NMOS transistor 11-1 to the power supply line 3, and a charging current $I_2$ (see FIG. 3) flows via the common node N2, and the PMOS transistor $21d$ to the bit lines $BL_1$ to $BL_P$ through the PMOS transistor 12-1 from power supply line 4. By the sensing action of the sense amplifiers $10b_1$ to $10b_p$, slight potential differences on the pairs of bit lines $BL_1$, $\overline{BL}_1$ to $BL_p$, $\overline{BL}_p$ are detected and amplified.

After adequate amplification by the sense amplifiers $10b_1$ to $10b_p$, the column decode select signal $YD_1$ is raised from the low level to the high level and the transfer gate $32_1$ is turned on, and the potential on the pair of the bit lines $BL_1$ and $\overline{BL}_1$ is transferred to the data bus lines DB and $\overline{DB}$. Data is thus read from the desired memory cell $20_{11}$.

In this type of semiconductor memory device, the sense latch signals SLN and SLP are made to operate in a higher speed in order to perform the sensing operation at a higher speed. This can be achieved by increasing the size of the NMOS transistors 11-1 to 11-N and the PMOS transistors 12-1 to 12-N, or the power supply lines 3 and 4 shown in FIG. 2, and the conductors for the common nodes N1 and N2 shown in FIG. 2 are made of metal (e.g., aluminum) having a lower sheet resistance to decrease the resistance.

The above memory device however is associated with the following problems.

(a) In a semiconductor memory device of a large capacity on the order of megabits, the power supply lines 3 and 4 may be as long as 15 mm and the line resistance cannot be neglected. For instance, when the power supply lines 3 and 4 are made of aluminum having a low sheet resistance, the sheet resistance is 0.06 $\Omega$ when the film thickness is 600 angstroms. If the conductor-length/conductor-width from the Vss pad 1 or the Vcc pad 2 to the farthest memory cell array 10-N or 10-1 is 15 mm/100 $\mu$m, the line resistance will be 0.06 $\Omega \times 15000/100 = 9 \Omega$.

With such a line resistance r, differences are created in the power supply resistance from the Vss pad 1 or the Vcc pad 2 to the respective memory cell arrays 10-1 to 10-N, and differences are created in the operation margin between the memory cell arrays 10-1 to 10-N, and access delays and the like are also created.

(b) With the prior art semiconductor memory devices, it is possible to increase the speed of the sensing operation by enlarging the size of the sense amplifier drive NMOS transistors 11-1 to 11-N and PMOS transistors 12-1 to 12-N, or by using metal of a smaller sheet resistance for the power supply lines 3 and 4 and the conductors for the common nodes N1 and N2. However, increase of the sensing operation may be accompanied with the increase in the charging current $I_2$ and discharging current $I_1$, and substantial drop in the Vcc level on the power supply lines 4 and 3 or substantial rise in the Vss level. (See FIG. 4.) When this drop or rise occurs, it acts as a noise giving an adverse effect on the operation after the sense latch, causing access delay or varying the circuit threshold value. Specifically, reduction in the TTL margin of the initial-stage circuit provided in the peripheral circuits 13-1 to 13-4 and operating responsive to TTL level (transistor-transistor logic level) or the like may occur.

(c) A further problem is associated with the differences between in the line resistances for the respective memory cell arrays.

As illustrated in FIG. 2, line resistance r is present on the power supply lines 3 and 4, so the power supply resistances at the junctions with the memory cell arrays 10-1 to 10-N differ from each other. For instance, with respect to the memory cell array 10-1, the resistance of the power supply line 3 at the junction with the NMOS transistor 11-1 is small, and the resistance of the power supply line 4 at the junction with the PMOS transistor 12-1 is large. A large Vss noise is created in the vicinity of the Vss pad 1, and the Vcc noise in the vicinity of the Vcc pad 4 is small. In contrast, when the memory cell array 10-N is made to operate the Vss noise in the vicinity of the Vss pad 1 is small, and the Vcc noise in the vicinity of the Vcc pad 2 is large. As a result, the noises in the vicinities of the power supply pads 1 and 2 differ depending on which of the memory cell arrays 10-1 to 10-N is made to operate.

The noises are transmitted via the power supply pads 1 and 2 to the power supply lines 112 and 122 adversely affecting the peripheral circuits connected thereto. In particular, in the input initial-stage circuits receiving $\overline{RAS}$ (row address strobe), $\overline{CAS}$ (column address strobe), and other control signals of the TTL level (not shown), and operating on the TTL level, when the memory cell array 10-1 is made to operate, the Vss noise is large, so the high-level-side margin in the input initial-stage circuits declines. When the memory cell array 10-N is made to operate, the Vcc noise is large, so the low-level-side margins declines. Thus, depending on which of the memory cell arrays 10-1 to 10-N operates, the operation margin of the input initial-stage circuits occur may differ and decline, and, as a result, malfunctions of the peripheral circuits including the input initial-stage circuits can occur.

SUMMARY OF THE INVENTION

The invention aims at solving the problems in the prior art.

An object of the present invention is to reduce the difference in the operation margin due to the power supply resistance of the memory cell arrays.

Another object of the invention is to reduce the difference in the operation margin due to the increase of the charging and discharging currents during the sense amplifier operation.

A further object of the invention is to reduce the difference between the noises in the vicinity of the power supply pads which differ depending on the memory cell array that operates, thereby to reduce the adverse effects such as malfunctions of the peripheral circuits including the input initial-stage circuits.

In order to solve the above problem, a semiconductor memory device according to a first aspect of the invention comprises a plurality of memory cell arrays, in which a potential difference between a pair of bit lines to which memory cells are connected is detected and amplified by a sense amplifier operating responsive to a sense latch signal on a common node, and the memory cells are connected via a power supply line to a power supply, characterized in that:

the power supply line comprises a main line disposed along the plurality of memory cell arrays and an auxiliary line disposed within each memory cell array; and the main line and the auxiliary line are connected to each other via a resistive element having a resistance larger than the resistance over the main line from the power supply to the memory cell array located farthest from the power supply.

With the above arrangement, the power supply voltage supplied from the power supply is supplied via the main line and respective resistive elements, and further via the auxiliary lines to the memory cell arrays. The resistive elements are set to have a larger resistance than the line resistance over the main line, so the line resistance is effectively neglected, and the power supply resistance of each memory cell array is determined by the resistance of the resistive element. Accordingly, the difference between the power supply resistances for the memory cell arrays are reduced, and the difference in the operation margin of the memory cell arrays is reduced. As a result, setting of the timing of control for accessing or the like is facilitated.

A semiconductor memory device of a second aspect of the invention is characterized in that:

the common node in each memory cell array is connected to the power supply line via a series connection of a resistive element and a sense amplifier drive transistor which is turned on and off by a control signal.

With the above arrangement, when the sense amplifier drive transistor is turned on, the sense latch signal output from the transistor is applied to the sense amplifiers via the common nodes in the memory cell arrays, and the sense amplifiers operate to detect and amplify the potential difference between the pair of the bit lines. Charging and discharging currents that flow between the sense amplifiers and the power supply lines are however reduced by the resistive elements, and the variation in the power supply potential is reduced, and the operation margin is reduced due to the reduction in noise.

The semiconductor memory device of the second aspect of the invention recited above may further be provided with a switching device which is connected in parallel with the resistive element, and is turned on and off by a switching signal delayed from the control signal by a predetermined time.

The switching device is turned on, during the operation of the sense amplifier, responsive to the switching signal, being delayed from the sense amplifier drive transistor by the predetermined time. Accordingly, variation in the charging and discharging currents flowing through the sense amplifier drive transistor is distributed, so the attendant power supply noise is reduced, and the data transfer speed is improved preventing the reduction in the speed of the operation due to the insertion of the resistive element.

A semiconductor memory device of a third aspect of the invention comprises:

a plurality of memory cells connected at the intersections of a plurality of word lines and a plurality of pairs of bit lines;

a plurality of sense amplifiers for detecting and amplifying the potential difference between the pair of bit lines;

a plurality of transistors turned on by a control signal and each connecting a predetermined number of the plurality of sense amplifiers to a power supply line;

wherein said plurality of transistors have mutual conductances which differ depending on the resistance of the power supply line.

With the above arrangement, in the vicinity of the power supply pad where the power supply resistance is small, the mutual conductance of the transistor is made small, and where the power supply resistance is large, the mutual conductance of the transistor is made large. Accordingly, the on-resistance of the transistor connected at the location where the power supply resistance is small is large, so the charging and discharging currents which flow instantly between the sense amplifiers and the power supply lines are restrained, and the noises created in the power supply lines are reduced.

In addition, since the mutual conductance of the transistor connected to a location where the power supply resistance is considerably large, the charging and discharging currents which flow instantly between the power supply lines and the sense amplifiers is decreased, and the difference in the noise due to the difference of the memory cell array that operates is reduced. As a result, the Vcc noise and the Vss noise are kept constant whichever transistor is made to operate, and the difference and lowering of the operation margin in the peripheral circuit including the input initial-stage circuits can be prevented, and the above problem is therefore solved.

DETAILED DESCRIPTION OF THE PREFERRED EMBODIMENTS

First Embodiment

Figure 5:
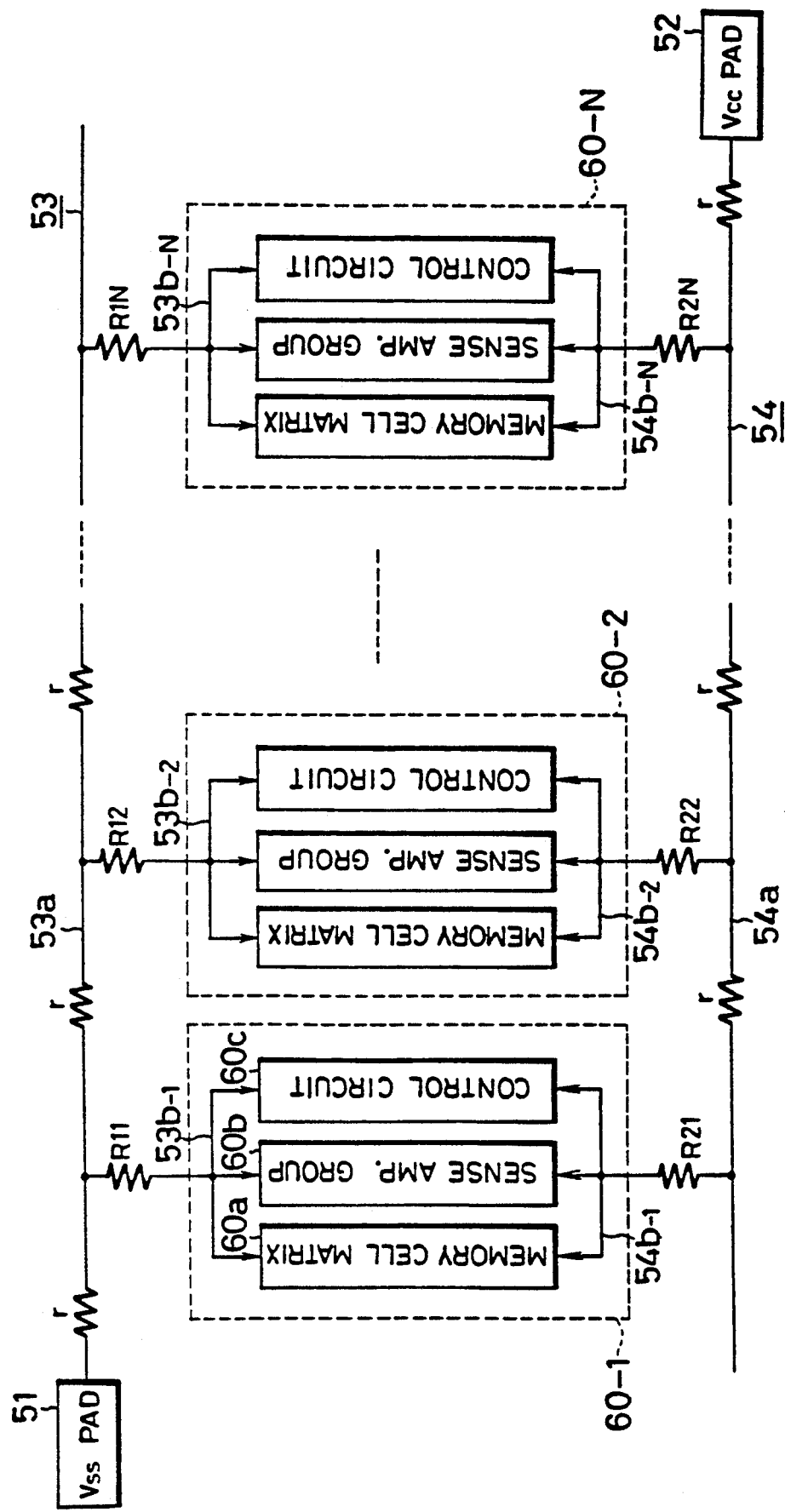
FIG. 5 is a diagram showing the configuration of the semiconductor memory device of a first embodiment of the invention.

FIG. 5 is a schematic diagram showing a semiconductor memory device, e.g., a dynamic RAM, of a first embodiment of the invention.

This semiconductor memory device is provided with a Vss power supply pad 51 and a Vcc power supply pad 52. Connected to the power supply pad 51 is a Vss power supply line (interconnection) 53. Connected to the power supply pad 52 is a power supply line 54. A plurality of memory cell arrays 60-1 to 60-N are connected between the power supply lines 53 and 54.

The power supply line 53 on the Vss side comprises a main line 53a disposed along the memory cell arrays 60-1 to 60-N from the Vss pad 51, and auxiliary lines 53b-1 to 53b-N disposed within the memory cell arrays 60-1 to 60-N, and the main lines 53a and the auxiliary lines 53b-1 to 53b-N are mutually connected via resistive elements R11 to R1N. Similarly, the power supply line 54 on the Vcc side comprises a main line 54a disposed along the memory cell arrays 60-1 to 60-N from the Vss pad 52, and auxiliary lines 54b-1 to 54b-N disposed within the memory cell arrays 60-1 to 60-N, and the main lines 54a and the auxiliary lines 54b-1 to 54b-N are mutually connected via resistive elements R21 to R2N. The main lines 53a and 54a have a line resistance (impedance) distributed along itself.

Each of the memory cell arrays 60-1 to 60-N comprises a memory cell matrix 60a consisting of a matrix arrangement of memory cells at the intersections of a plurality of word lines and bit line pairs, and a sense amplifier group 60b comprising a plurality of sense amplifiers for detecting and amplifying the slight potential differences between the corresponding bit line pairs, and a control circuit 60c for controlling the operation of the memory cell array.

Figure 3:
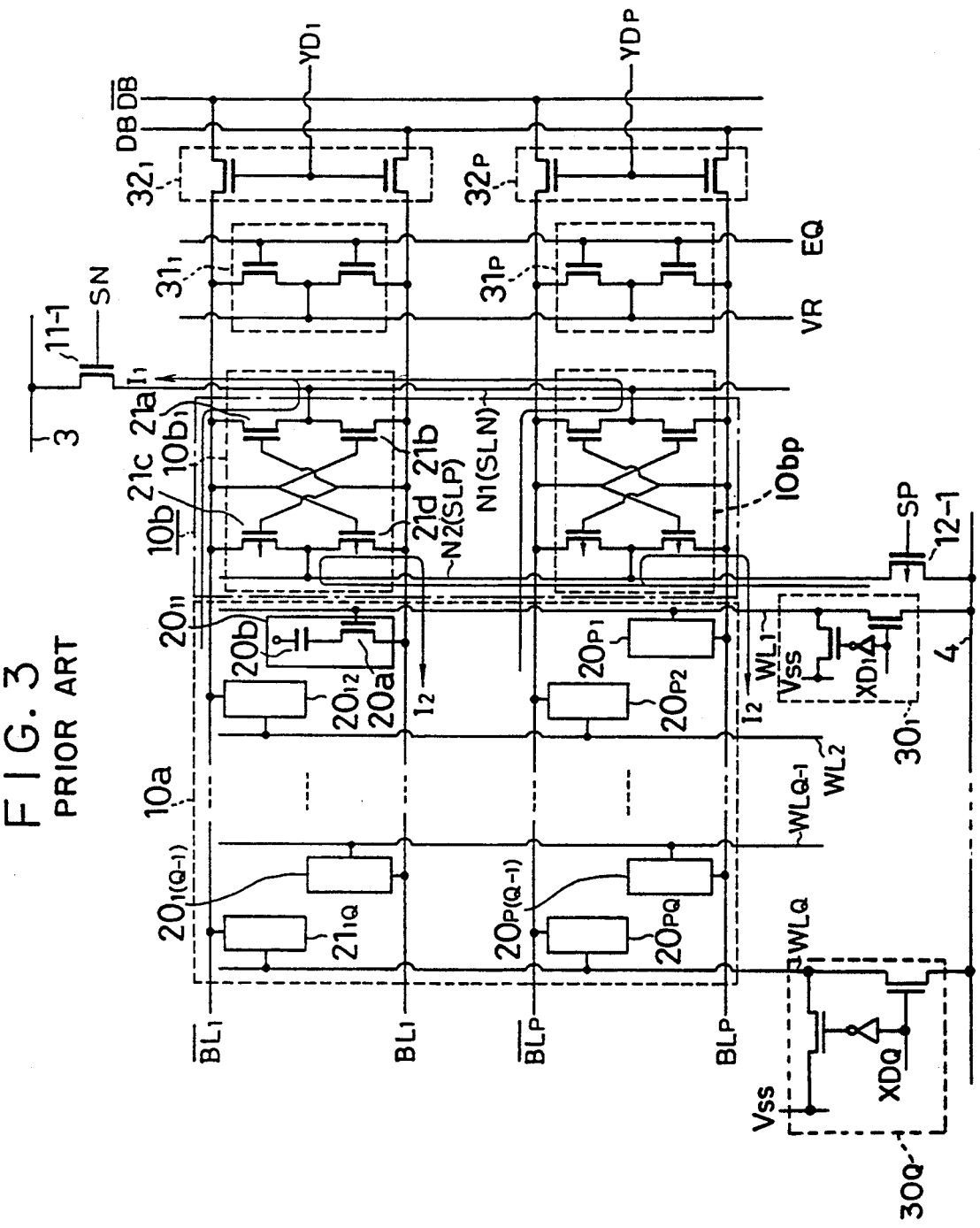
FIG. 3 is a circuit diagram showing the memory cell array in FIG. 2.
Figure 4:
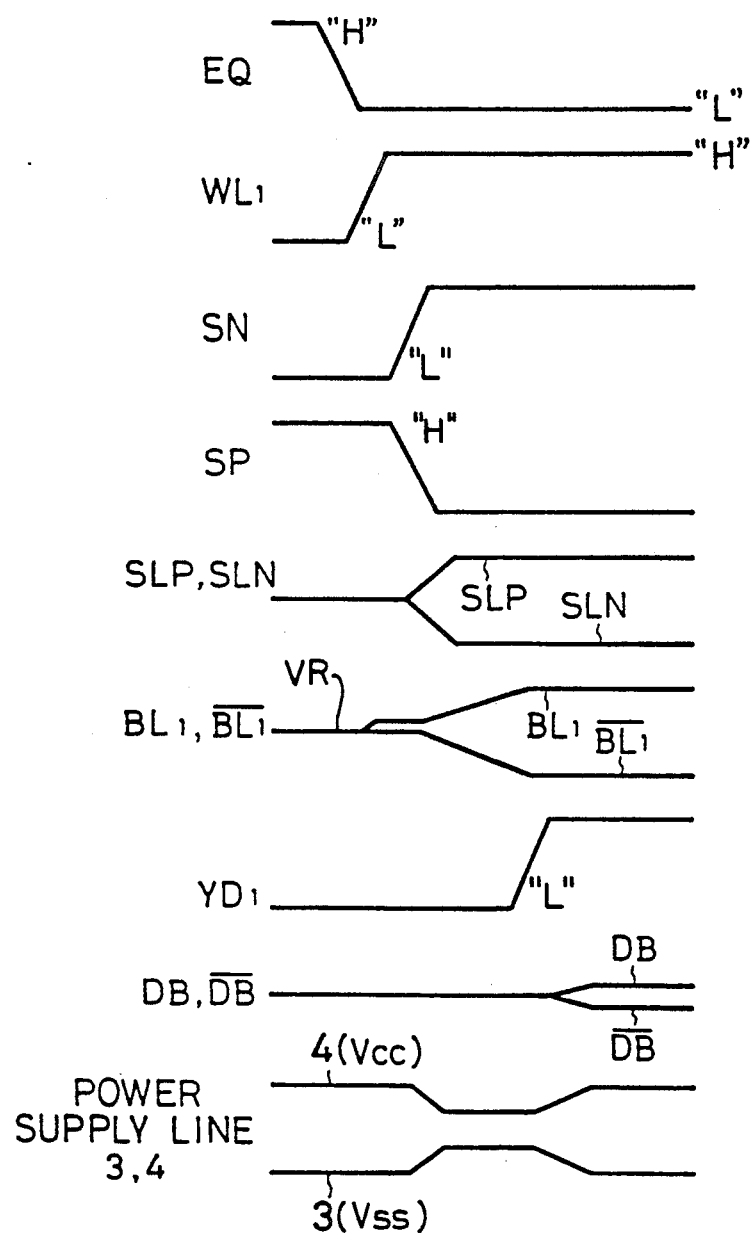
FIG. 4 is a waveform diagram for explaining the operation of the semiconductor memory device of FIG. 3.

The memory cell matrix 60a, the sense amplifier group 60b and the control circuit 60c may be similar to those shown in FIG. 3.

An input circuit for inputting signals from the outside of the chip, an output circuit for outputting information of the memory cells to the outside, and a writing circuit for writing data from the outside in the memory cells, which are not shown, are also connected to the Vss pad 51 and the Vcc pad 52.

When the power supply voltage is applied via the Vss pad 51 and the Vss pad 52, the power supply voltage is supplied via the power supply lines 53 and 54, the resistive elements R11 to R1N and R21 to R2N, to the memory cell arrays 60-1 to 60-N. The memory cell arrays 60-1 to 60-N are then brought into the operative condition, and the data reading or writing is performed on the memory cell matrix 60a in the memory cell arrays 60-1 to 60-N.

Let us now consider the Vss power supply resistance within memory cell arrays 60-1 to 60-N. For the first memory cell array 60-1, it is R11+r; for the second memory cell array 60-2, it is R12+2r, for the N-th memory cell array, it is R1N+Nr. In order to reduce the difference in the Vss power supply resistance between the memory cell arrays 60-1 to 60-N, the ratio of the resistance Nr of the line to the resistance of the resistive element R1N should be reduced, i.e., the resistance Nr of the line be reduced and the resistance of the resistive element R1N be enlarged to reduce the effects of the line resistance r.

As a way of reducing the line resistance Nr, if the number of the memory cell arrays 60-1 to 60-N is fixed, the line resistance r of the main line 53a should be reduced. To reduce the line resistance r, the width of the line should be increased or the sheet resistance of the line should be reduced. let us assume a situation in which the line resistance Nr is set at a certain value. In this case, the resistance of the resistive element R1N is set larger than the line resistance Nr, then the line resistance Nr can effectively be neglected, so the difference in the Vss power supply resistance between the memory cell arrays 60-1 to 60-N can be reduced.

The resistance R1i (i=1 to N) may be so set that:

$$R11 = R12 = \ldots = R1N >> Nr$$

or $$R11 + r \approx R12 + 2r \approx \ldots \approx R1N + Nr$$

In either case, the resistance R1i can be realized by forming the resistive elements R11 to R1N of a material having a large sheet resistance (such as polysilicon, tungsten-polycide, or the like), rather than aluminum which is a metal line. The above measure of reducing the difference between the Vss power supply resistance can be also applied to the Vcc power supply resistance.

By inserting the resistive elements R11 to R1N and R21 to R2N between the main lines 53a and 54a, respectively and the auxiliary lines 53b-1 to 53b-N and 54b-1 to 54b-N, so that the power supply resistance of the memory cell arrays 60-1 to 60-N is determined effectively by the resistive elements R11 to R1N and R21 to R2N, the difference in the power supply resistance between the memory cell arrays can be reduced.

The insertion of the resistive elements R11 to R1N and R21 to R2N increases the power supply resistance for the memory cell arrays 60-1 to 60-N. The circuit operation speed is therefore lowered by a certain degree. But as the provision of the resistive elements R11 to R1N and R21 to R2N reduces the difference in the operation margin between the memory cell arrays 60-1 to 60-N, setting of the control timing for the data reading and writing is facilitated, and this merit is greater than the demerit of the reduction in the operation speed.

Second Embodiment

Figure 6:
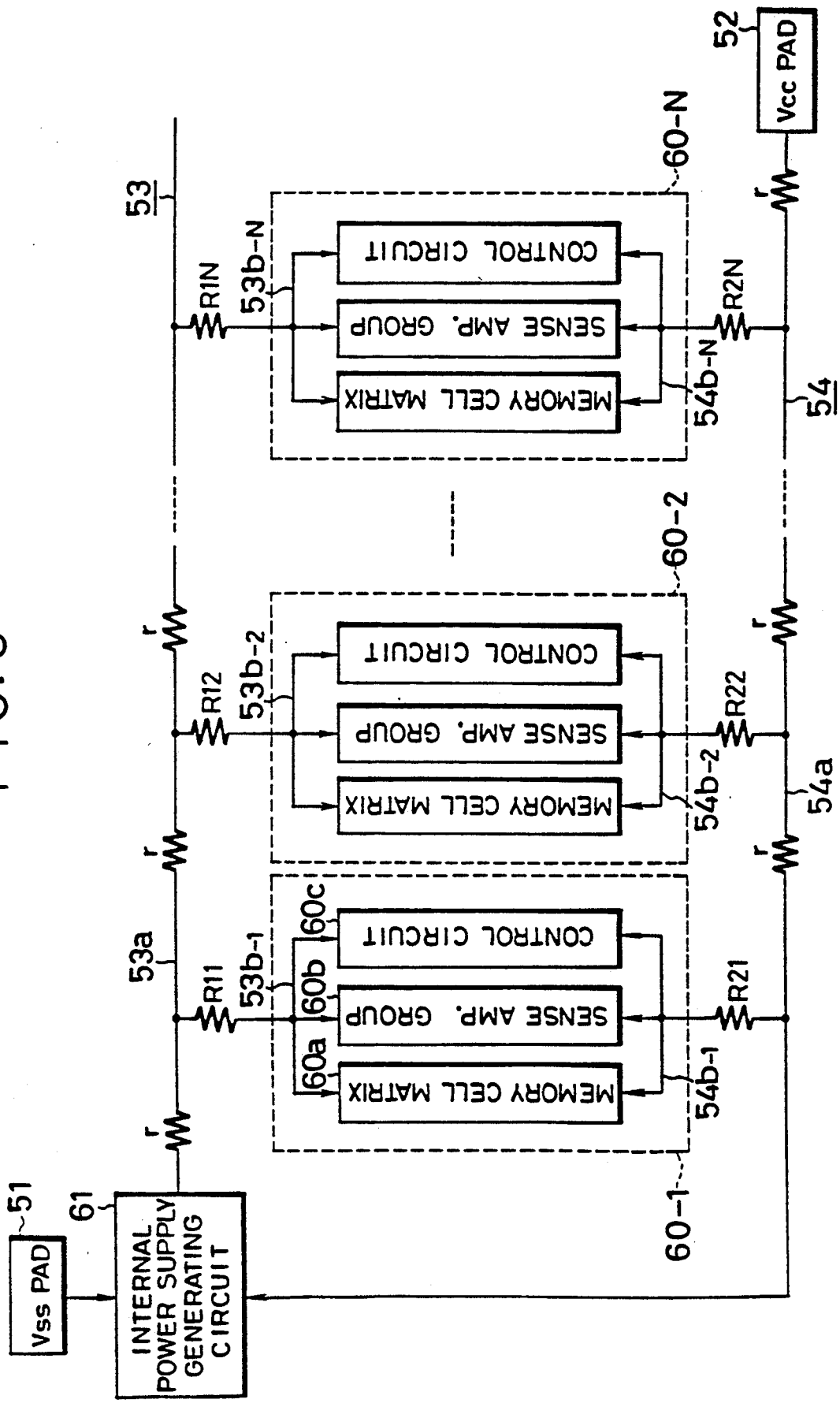
FIG. 6 is a diagram showing the configuration of the semiconductor memory device of a second embodiment of the invention.

FIG. 6 schematically illustrates a semiconductor memory device of a second embodiment of the invention. Elements common with FIG. 5 are given identical reference marks.

The difference of this semiconductor memory device from FIG. 5 is that an internal power supply generating circuit 61 is connected to the Vss pad 51, and the output node of the internal power supply generating circuit 61 is connected to the main lines 53a and 54a of the power supply conductors 53 and 54.

The internal power supply generating circuit 61 receives the power supply voltage from the Vcc pad 52, causes a predetermined voltage drop, and supplies a power supply voltage of a lower level than Vcc to the main lines 53a and 54a. It is formed of a resistor voltage divider, MOS transistors, or the like, and serves as a power supply circuit.

Providing the above-described internal power supply generating circuit 61, and driving the memory matrix 60a within the memory cell arrays 60-1 to 60-N with the lower level power supply voltage, deterioration of the memory elements can be prevented. Moreover, with the provision of the resistive elements R11 to R1N and R21 to R2N, the difference in the operation margin between the memory cell arrays 60-1 to 60-N can be reduced, as in the first embodiment.

Third Embodiment

Figure 7:
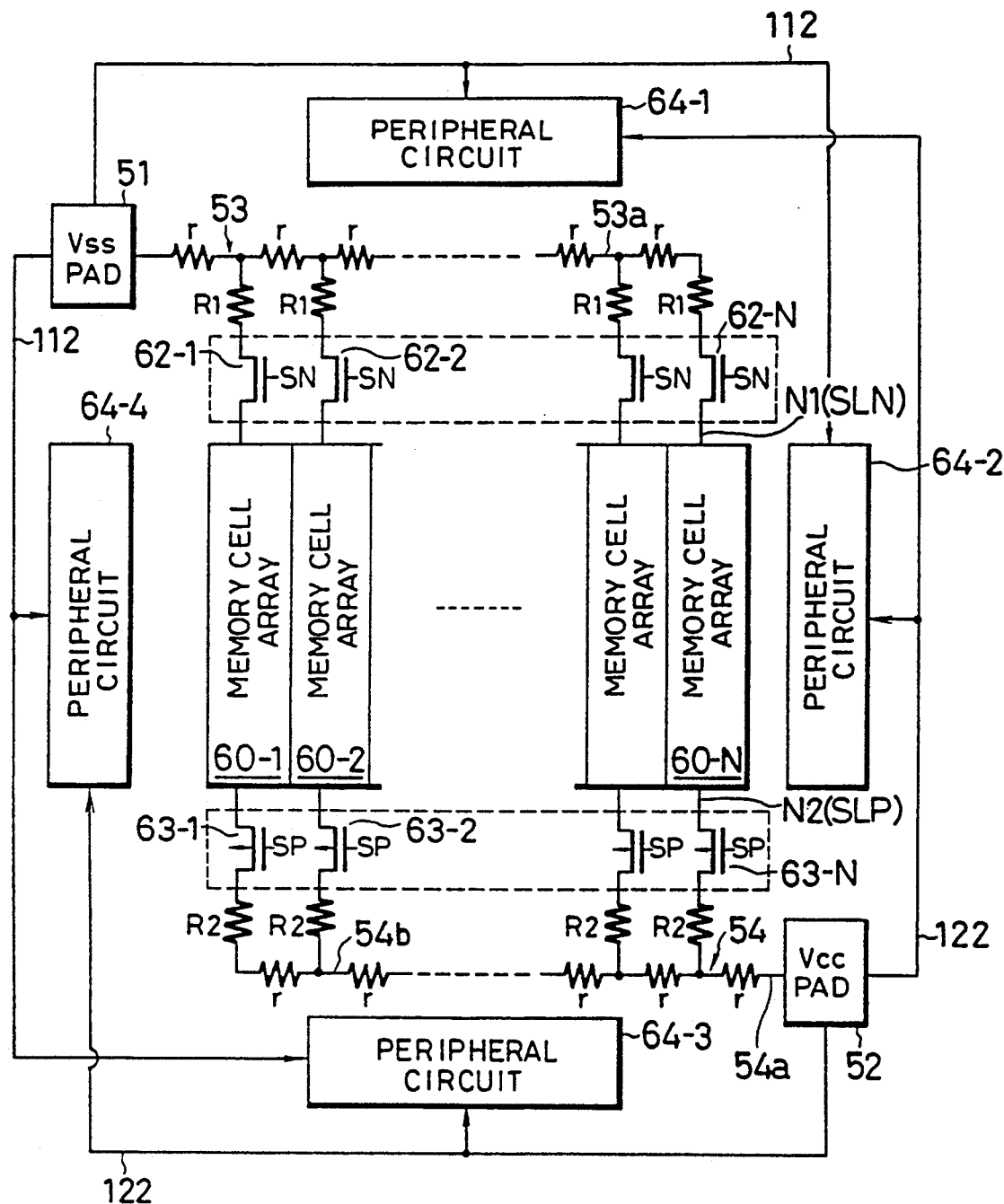
FIG. 7 is a diagram showing the configuration of the semiconductor memory device of a third embodiment of the invention.

FIG. 7 shows a semiconductor memory device of a third embodiment of the invention. Identical elements to those in FIG. 5 are denoted by identical reference marks.

This semiconductor memory device is provided with common nodes N1 and N2 which also correspond to the power supply auxiliary lines 53b and 54b in FIG. 5 and FIG. 6, and which serve to transfer for transferring the sense latch signals SLN and SLP into the memory cell arrays 60-1 to 60-N. The common nodes N1 (power supply auxiliary line 53b) within the memory cell arrays 60-1 to 60-N are connected via sense amplifier drive NMOS transistors 62-1 to 62-N which are turned on and off by the control signal SN, and the resistive elements R1, to the power supply main line 53a, which is connected to the Vss pad 51. Similarly, the common nodes N2 (power supply auxiliary line 54b) within the memory cell arrays 60-1 to 60-N are connected via sense amplifier drive PMOS transistors 63-1 to 63-N which are turned on and off by the control signal SP, and the resistive elements R2, to the power supply auxiliary line 54b, which is connected to the Vcc pad 52.

Connected to the Vss pad 51 and the Vcc pad 52 are peripheral circuits 64-1 to 64-4 for controlling input and output of the semiconductor memory device.

Figure 8:
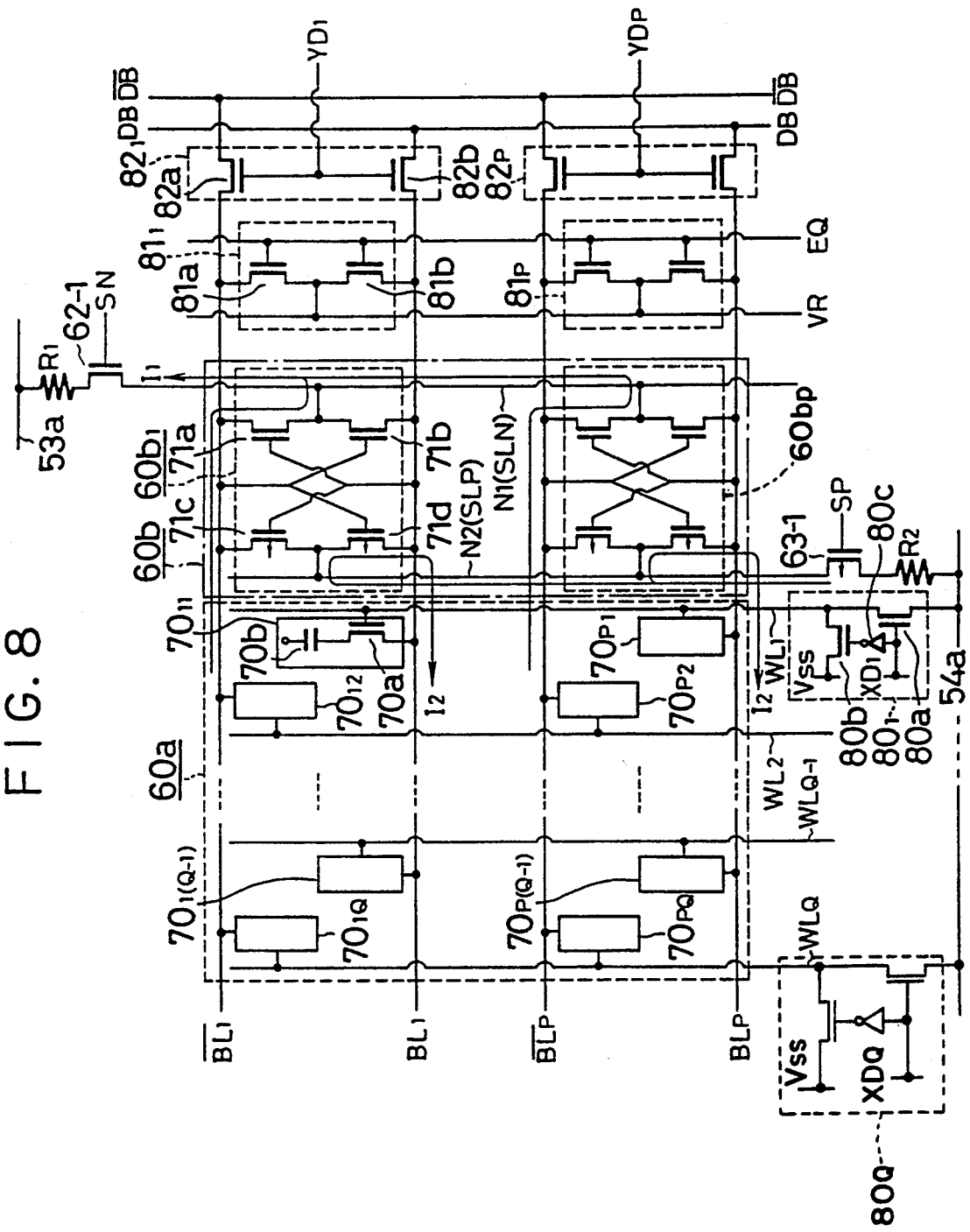
FIG. 8 is a diagram showing the memory cell array in the semiconductor memory device of FIG. 7.

Like the embodiment of FIG. 5, each of the memory cell arrays 60-1 to 60-N comprises a memory cell matrix 60a, sense amplifiers 60b and a control circuit 60c. Their details are shown in FIG. 8.

The illustrated memory cell array 60-1 comprises a memory cell matrix 60a for storing data, a sense amplifier group 60b comprising a plurality of sense amplifiers $60b_1$ to $60b_P$ for detecting and amplifying the potential difference between the pairs of bit lines, and a control circuit for controlling the memory cell array 60-1. This control circuit comprises a plurality of word line drive circuits $80_1$ to $80_P$ a plurality of precharge circuits $81_1$ to $81_P$, a plurality of transfer gates $82_1$ to $82_P$, and the like.

The memory cell matrix 60a is for storing data, and has a plurality of word lines $WL_1$ to $WL_Q$, a plurality of pairs of bit lines $BL_1$, $\overline{BL}_1$ to $BL_P$, $\overline{BL}_P$, and memory cells $70_{11}$ to $70_{PQ}$ connected at their intersections. The memory cells $70_{11}$ to $70_{PQ}$ are each configured of a one-transistor memory cell which is formed of NMOS transistor 70a and a capacitor 70b.

Connected to the pairs of the bit lines $BL_1$, $\overline{BL}_1$, to $BL_P$, $\overline{BL}_P$ is the sense amplifier group 60b. The sense amplifiers group 60b is comprised of a plurality of sense amplifiers $60b_1$ to $60b_P$ which detect and amplify the potential differences between the pairs of the bit lines $BL_1$, $\overline{BL}_1$ to $BL_P$, $\overline{BL}_P$, and which are driven by the sense latch signals SLN and SLP on the common nodes N1 and N2. The sense amplifiers $60b_1$ to $60b_P$ are each configured of a flip-flop comprised of NMOS transistors 71a and 71b, and PMOS transistors 71c and 71d cross-coupled with the pairs of the bit lines $BL_1$, $\overline{BL}_1$ to $BL_P$, $\overline{BL}_P$.

The word line drive circuits $80_1$ to $80_Q$ connected to the word lines $WL_1$ to $WL_Q$ set the word lines $WL_1$ to $WL_Q$ to the high level or the low level responsive to the column decode select signal $XD_1$ to $XD_Q$, and are formed of NMOS transistors 80a and 80b, and an inverter 80c. The precharge circuits $81_1$ to $81_P$ connected to the pairs of bit lines $BL_1$, $\overline{BL}_1$ to $BL_P$ to $\overline{BL}_P$ precharge the bit lines $BL_1$, $\overline{BL}_1$ to $BL_P$, $\overline{BL}_1$ to the reference potential VR in accordance with the precharge signal EQ, and are formed of NMOS transistors 81a and 81b. The transfer gates $82_1$ to $82_P$ connected to the pairs of bit lines $BL_1$, $\overline{BL}_1$ to $BL_P$ to $\overline{BL}_P$ transfer the information of the memory cells $70_{11}$ to $70_{PQ}$ to the complementary data lines DB, $\overline{DB}$ and are formed of NMOS transistors 82a and 82b which are turned on and off by the column decode select signals $YD_1$ to $YD_P$.

Figure 9:
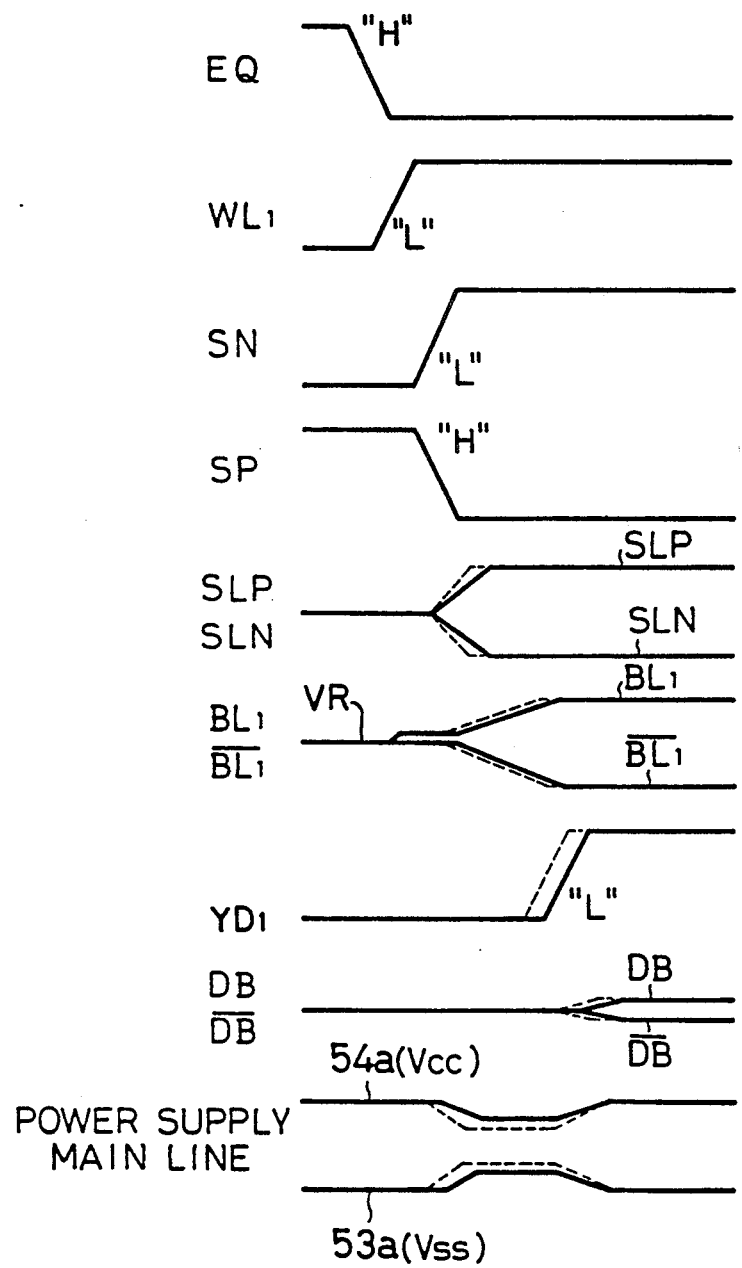
FIG. 9 is a waveform diagram for explaining the operation of the semiconductor memory device of FIG. 8.

FIG. 9 is a waveform diagram for explaining the operation of the circuit of FIG. 8. The operation of the semiconductor device of FIG. 7 and FIG. 8 will now be described with reference to FIG. 9. In FIG. 9, the waveforms in solid line represents the third embodiment and the broken line represents the prior art.

Let us assume a situation in which data "1" which is stored in the memory cell $70_{11}$ is read out.

During stand-by, the precharge signal EQ is at the high level ("H"), and the precharge circuit $81_1$ to $81_P$ are on, and the pairs of bit lines $BL_1$, $\overline{BL}_1$ to $BL_P \overline{BL}_P$ are precharged to the reference potential VR. When reading is performed, the precharge signal EQ is lowered from the high level ("H") to the low level. The precharge circuits $81_1$ to $81_P$ are then turned off, and the supply of the reference potential to the pairs of bit lines $BL_1$, $\overline{B}_1$ to $BL_P$, $\overline{BL}_P$ is stopped to terminate the precharge.

The word lines drive circuit $80_1$ is then activated by the column decode select signal $XD_1$. The NMOS transistor 80a in the word line drive circuit $80_1$ is then turned on and the power supply main line 54a and the word line $WL_1$ are then conductive to each other. The word line $WL_1$ is then raised from the low level ("L") to the high level. The NMOS transistor 70a in the memory cell $70_{11}$ connected to the word line $WL_1$ is turned on, and the information "1" stored in the capacitor 70b is output to the bit lines $Bl_1$, and a slight potential difference is created between each of the pairs of bit lines $BL_1$, $\overline{BL}_1$. At the same time, other memory cells $70_{21}$ to $70_{P1}$ connected to the same word line $WL_1$ are also activated and their data are transmitted to the respective bit line pairs $BL_2$, $\overline{BL}_2$ to $BL_P$, $\overline{BL}_P$.

When the control signals SN and SP are thereafter raised from the low level ("L") to the high level ("H"), the sense amplifier drive NMOS transistors 62-1 to 62-N and 63-1 to 63-N are turned on, and the sense latch signals SLN on the common nodes N1 are varied to the low level via the power supply main line 53a and the resistive elements R1, while the sense latch signals SLP on the common nodes N2 are varied to the high level via the power supply main line 54a and the resistive elements R2, so the sense amplifiers $60b_1$ to $60b_p$ are activated.

The sense amplifiers $60b_1$ to $60b_p$ detect slight potential differences on the pairs of bit lines $BL_1$, $\overline{BL}_1$ to $BL_P$, $\overline{BL}_P$, and discharge the potential on the bit line $\overline{BL}_1$ to $\overline{BL}_P$ via the NMOS transistors 71a of the respective sense amplifiers $60b_1$ to $60b_P$, and the discharging current $I_1$ (see FIG. 7) flows through the common node N1 and the NMOS transistor 62-1 and the resistive element R1 to the power supply main line 53a. Concurrently, a charging current $I_2$ (see FIG. 7) flows through the power supply main line 54a, the resistive element R2, the PMOS transistor 63-1, the common node N2, and the PMOS transistor 71d of the respective sense amplifiers $60b_1$ to $60b_P$, and by this charging current $I_2$ the bit line $BL_1$ to $BL_P$ are charged, and the potential differences on the pairs of bit lines $BL_1$, $\overline{BL}_1$ to $BL_P$, $\overline{BL}_P$ are are amplified.

After the potential differences on the pairs of bit lines $BL_1$, $\overline{BL}_P$ to $BL_P$, $\overline{BL}_P$ are fully amplified, the column decode select signal $YD_1$ is raised from the low level to the high level. The NMOS transistors 82a and 82b in the transfer gate $82_1$ are thereby turned on and the data on the pair of bit lines $BL_1$, $\overline{BL}_1$ is transferred to the data lines DB, $\overline{DB}$. Reading of data from the memory cell $70_{11}$ is thus achieved.

In this third embodiment, the drain of the NMOS transistor 62-1 outputting the sense latch signal SLN is connected via the resistive element R1 to the power supply main line 53a on the Vss side, and the drain of the PMOS transistor 63-1 outputting the sense latch signal SLP is connected via the resistive element R2 to the power supply main line 54a on the Vcc side. Accordingly, by virtue of the resistive elements R1 and R2, the discharging current $I_1$ and the charging current $I_2$ at the time of operation of the sense amplifiers can be restrained as compared with the prior art. Thus, as shown in FIG. 9, the rise of the Vss level and the fall of the Vcc level on the power supply main lines 53a and 54a are smaller than in the prior art.

Because the resistive elements R1 and R2 are provided, there is a disadvantage that the variation in the sense latch signals SLN and SLP and the potentials on the pairs of bit lines $BL_1$, $\overline{BL}_1$ are more delayed than in the prior art, but the rise in the Vss level and the fall in the Vcc level are restrained, so the delays in the access time during the operation of the circuit after the sense latch, and the degradation the operation margin such as the TTL margin degradation can be prevented, and these merits are greater.

Fourth Embodiment

Figure 10:
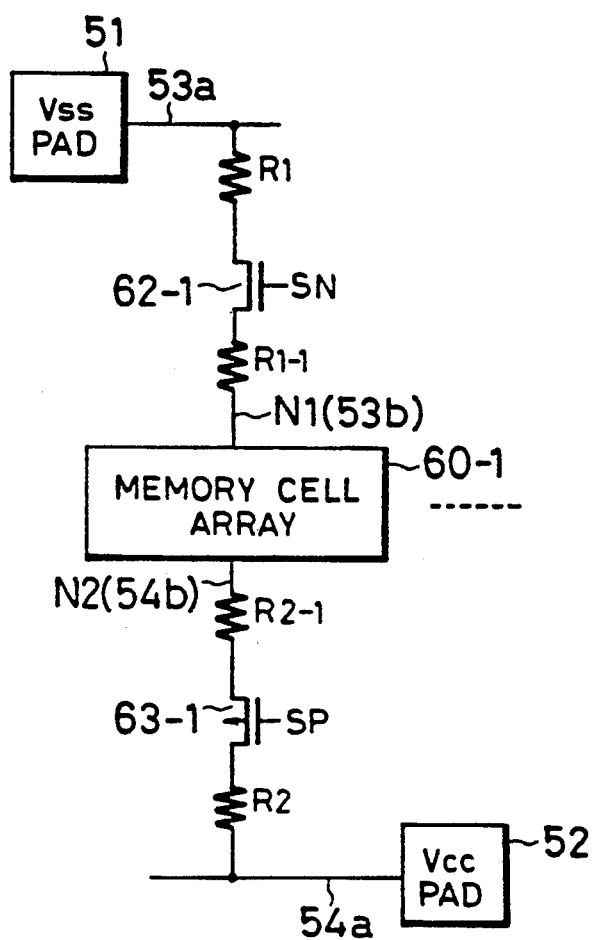
FIG. 10 is a diagram showing the configuration of the semiconductor memory device of a fourth embodiment of the invention.

FIG. 10 shows the pertinent portion of the semiconductor memory device of a fourth embodiment of the invention. Elements identical to those in FIG. 7 are denoted by identical reference marks.

This semiconductor memory device differs from the third embodiment in that the resistive elements R1-1 and R2-1 are respectively inserted on the side of the sources of the sense amplifier drive NMOS transistors 62-1 to 62-N and PMOS transistors 63-1 to 63-N, i.e., between the MOS transistors and the common nodes N1 and N2.

Figure 11:
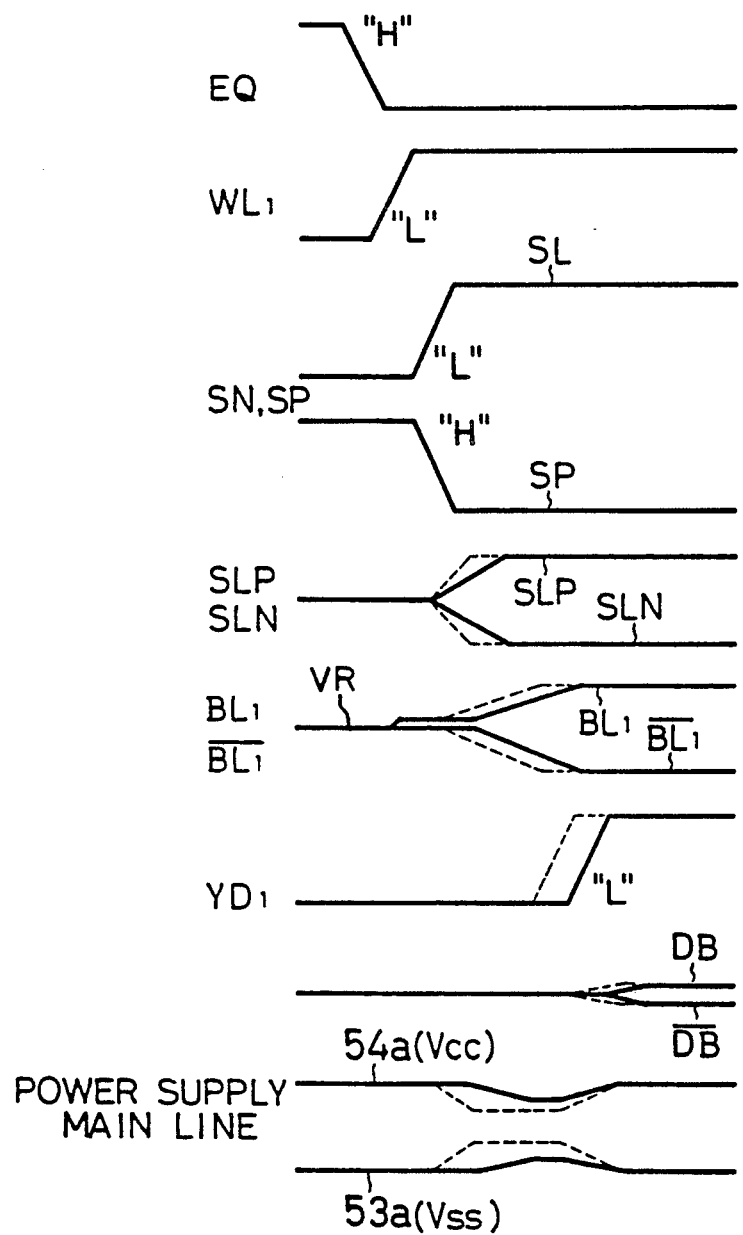
FIG. 11 is a waveform diagram for explaining the operation of the semiconductor memory device of FIG. 10.

FIG. 11 shows the waveforms for explaining the operation of FIG. 10. Detailed explanation of the waveforms of FIG. 11 is similar to the waveforms shown in FIG. 9 and will not be discussed here.

As illustrated, the provision of the resistive elements R1 and R1-1 on both sides of the NMOS transistors 62-1 to 62-N and the resistive elements R2 and R2-1 on both sides of the PMOS transistors 63-1 to 63-N gives further reduction in the rise of the Vss level and the fall of the Vcc level, than the third embodiment.

Similar results could be obtained without the resistive elements R1-1 and R2-1 if the resistances of the resistive elements R1 and R2 of FIG. 7 were enlarged. However, if the resistive elements R1 and R2 were formed of polysilicon or tungsten polycide as described in connection with the first embodiment, the length required could be to large, and there is actually a restriction on this aspect. The resistive elements R1-1 and R2-1 can be formed in place of the conductors connecting the memory cell arrays 60-1 and the transistors 62-1 and 63-1 (in other words, by forming the conductors of a material having a large resistance). For this reason, providing the resistive elements R1 and R1-1 on both sides of the NMOS transistors 62-1 and the resistive elements R2 and R2-1 on both sides of the PMOS transistors 63-1 to 63-N will require a smaller space to obtain the large resistance, thereby properly preventing the rise in the Vss level and the fall in the Vcc level.

Fifth Embodiment

Figure 12:
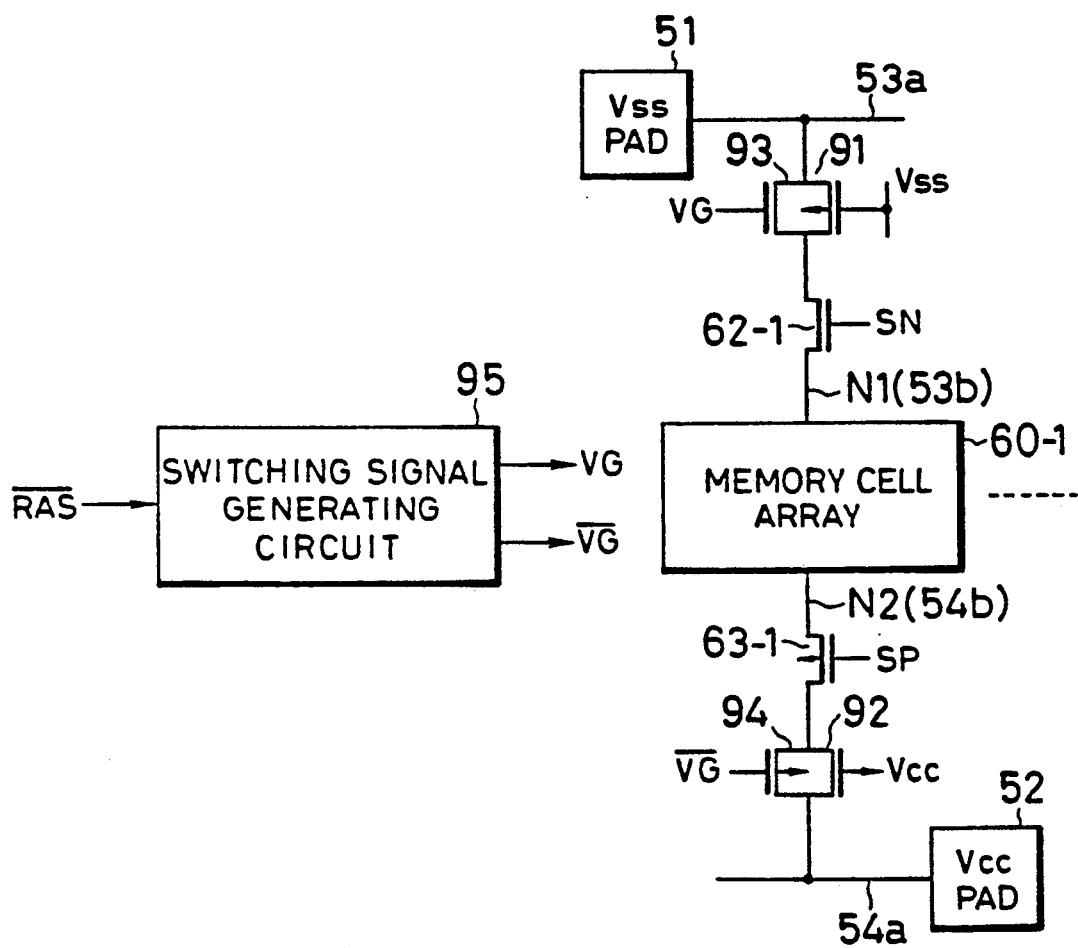
FIG. 12 is a diagram showing the configuration of the semiconductor memory device of a fifth embodiment of the invention.

FIG. 12 shows the pertinent portion of a fifth embodiment of the invention. Elements identical to those in FIG. 7 are denoted by identical reference numerals.

This semiconductor memory device differs from the third embodiment in that a PMOS transistor 91 is provided in place of the resistive element R1 and an NMOS transistor 92 is provided in place of the resistive element R2, and an NMOS transistor 93 serving as switching device is provided in parallel with the NMOS transistor 92, and a PMOS transistor 94 serving as switching device is provided in parallel with the NMOS transistor 92.

The PMOS transistor 91 has a threshold value Vtp, and its gate is connected to the Vss so that it is kept on, functioning as a load MOS transistor causing a voltage drop corresponding to the threshold value Vtp. The NMOS transistor 92 has a threshold value Vtn, and its gate is connected to the Vcc so that it is kept on, functioning as a load MOS transistor causing a voltage drop corresponding to the threshold value to provide a potential (Vcc−Vtn) at its drain.

The NMOS transistor 93 and the PMOS transistor 94 serving as switching devices are transistors turned on and off by switching signals VG and $\overline{VG}$ output from a switching signal generating circuit 95. The switching signal generating circuit 95 outputs the switching signals VG and $\overline{VG}$ delayed from the fall of the control signal (row address strobe signal) $\overline{RAS}$ by a predetermined time, and may be formed of a delay circuit comprising plurality of stages of inverters. The timing at which the switching signal VG rises is a little delayed from the rise of the control signal SN.

Figure 13:
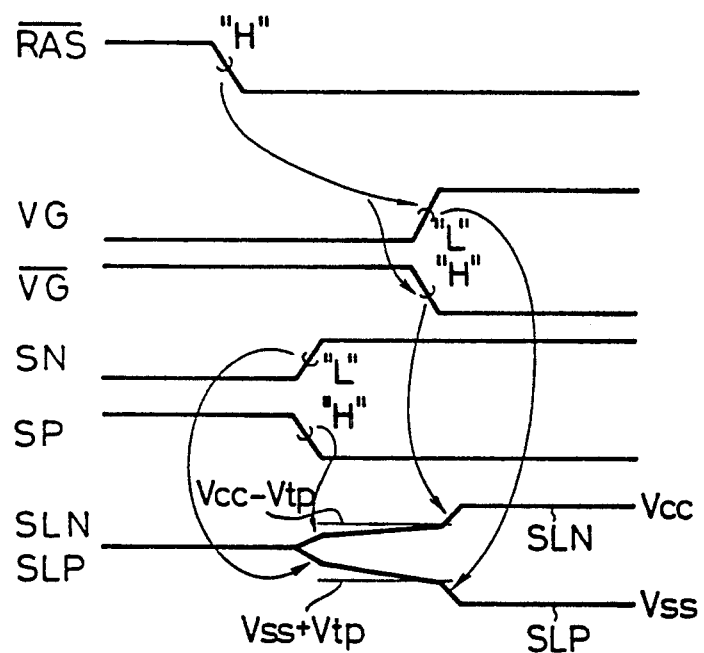
FIG. 13 is a waveform diagram for explaining the operation of the semiconductor memory device of FIG. 12.

FIG. 13 shows the waveform for explaining the operation of FIG. 12. The PMOS transistor 91 and the NMOS transistor 92 are kept on, and when the control signal SN rises and the control signal SP falls after the control signal $\overline{RAS}$ falls, the sense amplifier drive NMOS transistor 62-1 and PMOS transistor 63 are turned on. As a result, the sense latch signal SLN flowing through the NMOS transistor 62-1 falls to the potential (Vss+Vtp) and the sense latch signal SLP flowing through the PMOS transistor 63-1 rises to the potential (Vcc−Vtn).

When the switching signal VG output from the switching signal generating circuit 95 rises to the high level, the switching signal $\overline{VG}$ falls to the low level.

When the NMOS transistor 93 and the PMOS transistor 94 are turned on and the PMOS transistor 91 and the NMOS transistor 92 are shunted, and the sense latch signal SLN falls to the Vss level and the sense latch signal SLP rises to the Vcc level. With the variation of the sense latch signals SLN and SLP, the sense amplifier in the memory cell array 60-1 is activated, and the potential difference on the pair of bit lines is detected and amplified.

In this fifth embodiment, with the switching of the NMOS transistor 93 and the PMOS transistor 94, the sense latch signals SLN and SLP are made to fall or rise in two steps, so the rapid change of the sense latch signals SLN and SLP is alleviated, and the rapid change in the charging and discharging currents during the operation of the sense amplifiers are restrained. For this reason, the power supply noise that occurs on the power supply main lines 53a and 54a is divided into smaller pieces and the reduction in the data transfer speed which was a problem associated with the third embodiment can be prevented.

Various modifications can be made to the embodiments described above. Examples of the modifications are set forth below.

(a) In FIG. 7, the resistive elements R1 can be provided on the side of the sources of the NMOS transistors 62-1 to 62-N and the resistive elements R2 may be provided on the side of the sources of the PMOS transistors 63-1 to 63-N. Still similar merits to those of FIG. 7 are obtained.

Figure 1:
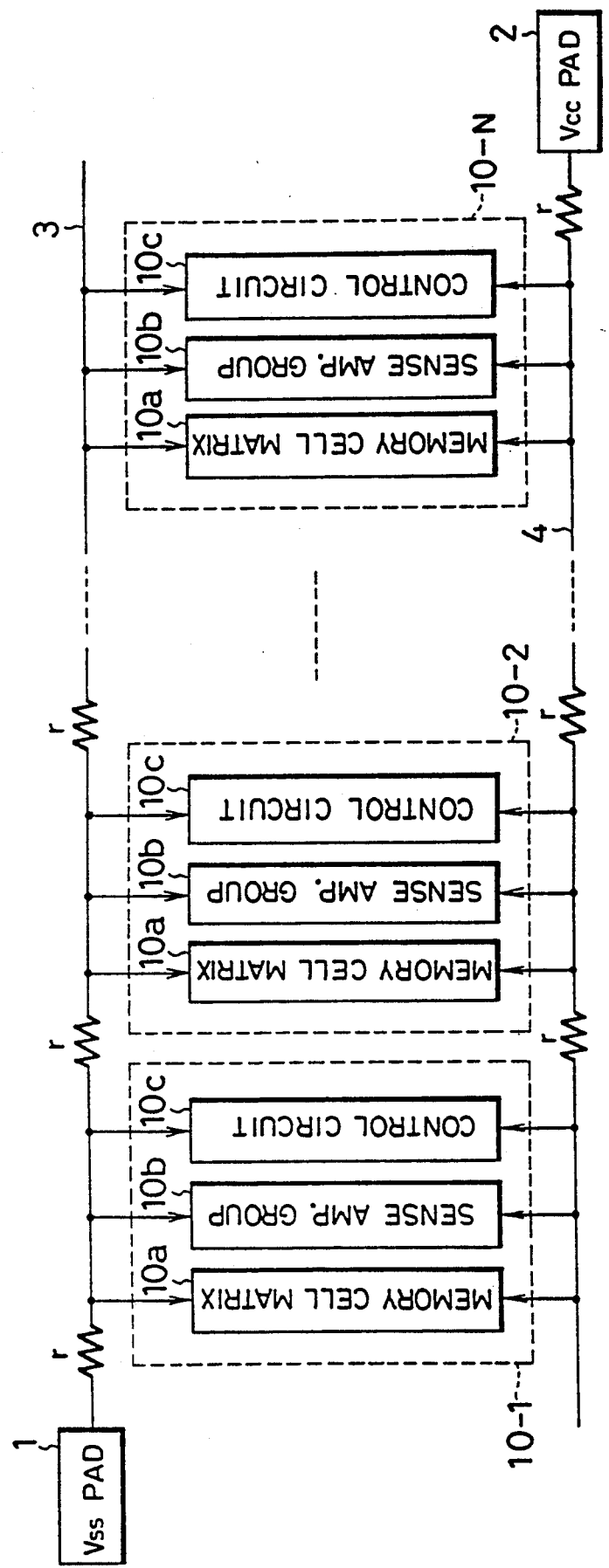
FIG. 1 is a diagram showing the configuration of the semiconductor memory device in the prior art.

(b) The first embodiment of FIG. 5 and the second embodiment of FIG. 6; and the third embodiment of FIG. 7 and the fourth embodiment of FIG. 10 may be combined to form a semiconductor memory device. For instance, the resistive elements R1 in FIG. 7 may be replaced by the resistive elements R11 to R1N in FIG. 5, and the resistive elements R2 in FIG. 7 may be replaced by the resistive elements R21 to R2N in FIG. 1. Note that the difference between the resistive elements R1, R2 and the resistive elements R11 to R1N, R21 to R2N is their resistance values, or the manner in which their resistance values are determined. Then, the difference in the operation margin between the memory cell arrays 60-1 to 60-N in FIG. 7 can be reduced, and the setting of the control timing for reading, writing etc. can be facilitated.

(c) The PMOS transistor 91 in FIG. 12 may be replaced by the resistive element R11 to R1N in FIG. 6, or by the resistive element R1 in FIG. 7 or FIG. 10. In addition, the NMOS transistor 92 in FIG. 12 may be replaced by the resistive element R21 to R2N in FIG. 6, or by the resistive elements R2 in FIG. 7 or FIG. 10. In addition, the switching signal generating circuit 95 in FIG. 12 may be so configured as to produce the switching signals $\overline{VG}$ and $\overline{V}$ using signals other than the control signal $\overline{RAS}$, e.g., the control signal SN, SP, or other signals.

Sixth Embodiment

Figure 14:
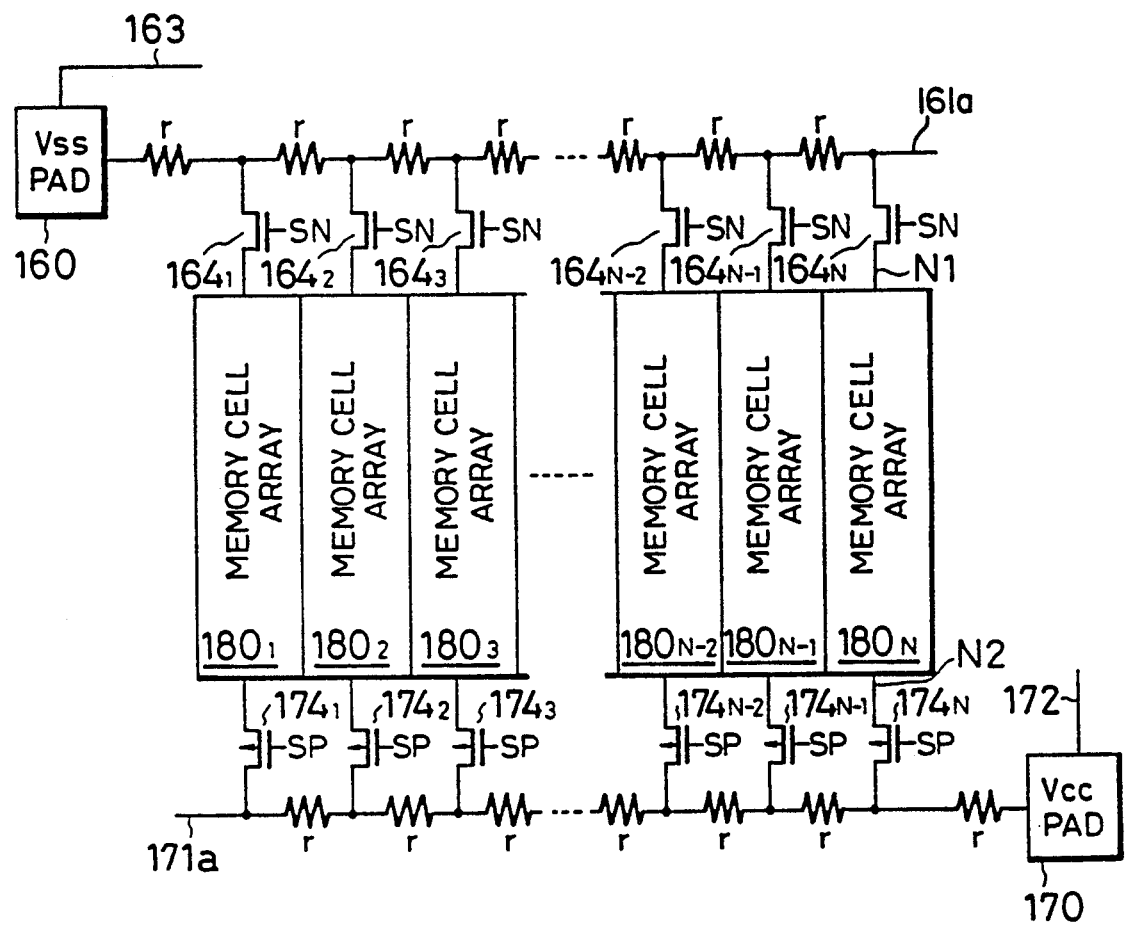
FIG. 14 is a diagram showing the pertinent portion of the semiconductor device of a sixth embodiment of the invention.

FIG. 14 is a diagram showing the pertinent portion of the semiconductor memory device of a sixth embodiment of the invention.

This semiconductor memory device is a dynamic RAM provided with a Vss power supply pad 160 and a Vcc power supply pad 170. Connected to the power supply pad 160 are a Vss power supply main line 161a and another Vss power supply line 163. Connected to the power supply pad 170 are a Vcc power supply lines 171a and another Vcc power supply line 172. The power supply main lines 161a and 171a are dedicated to the drive of sense amplifiers in order to prevent the adverse effect of the power supply noise at the time of the operation of the sense amplifiers. Connected to the other power supply lines 162 and 172 are peripheral circuits of the semiconductor memory device, including the input initial-stage circuits.

Connected to the power supply main line 161a are drains of NMOS transistors $164_1$ to $164_N$, sources of which are connected to common nodes N1 for activation of a plurality of sense amplifiers. Connected to the power supply main line 171a are drains of NMOS transistors $174_1$ to $174_N$, sources of which are connected to common nodes N2 for activation of the plurality of sense amplifiers. The NMOS transistors $164_1$ to $164_N$ are turned on and off by a control signal SN output from a control circuit (not shown), but similar to that described earlier in connection with other embodiments. The PMOS transistors $174_1$ to $174_N$ are turned on and off by a control signal SP output from the control circuit. Memory cell arrays $180_1$ to $180_N$ are connected between the common nodes N1 and N2.

The Vss power supply main line 161a has line resistance r, and the power supply resistance over the power supply main line 161a is increased with the distance from the Vss power supply pad 160. Similarly, the Vcc power supply main lines 171a has line resistance r, and the power supply resistance over the power supply line 171a is increased with the distance from the Vcc power supply pad 170.

Figure 2:
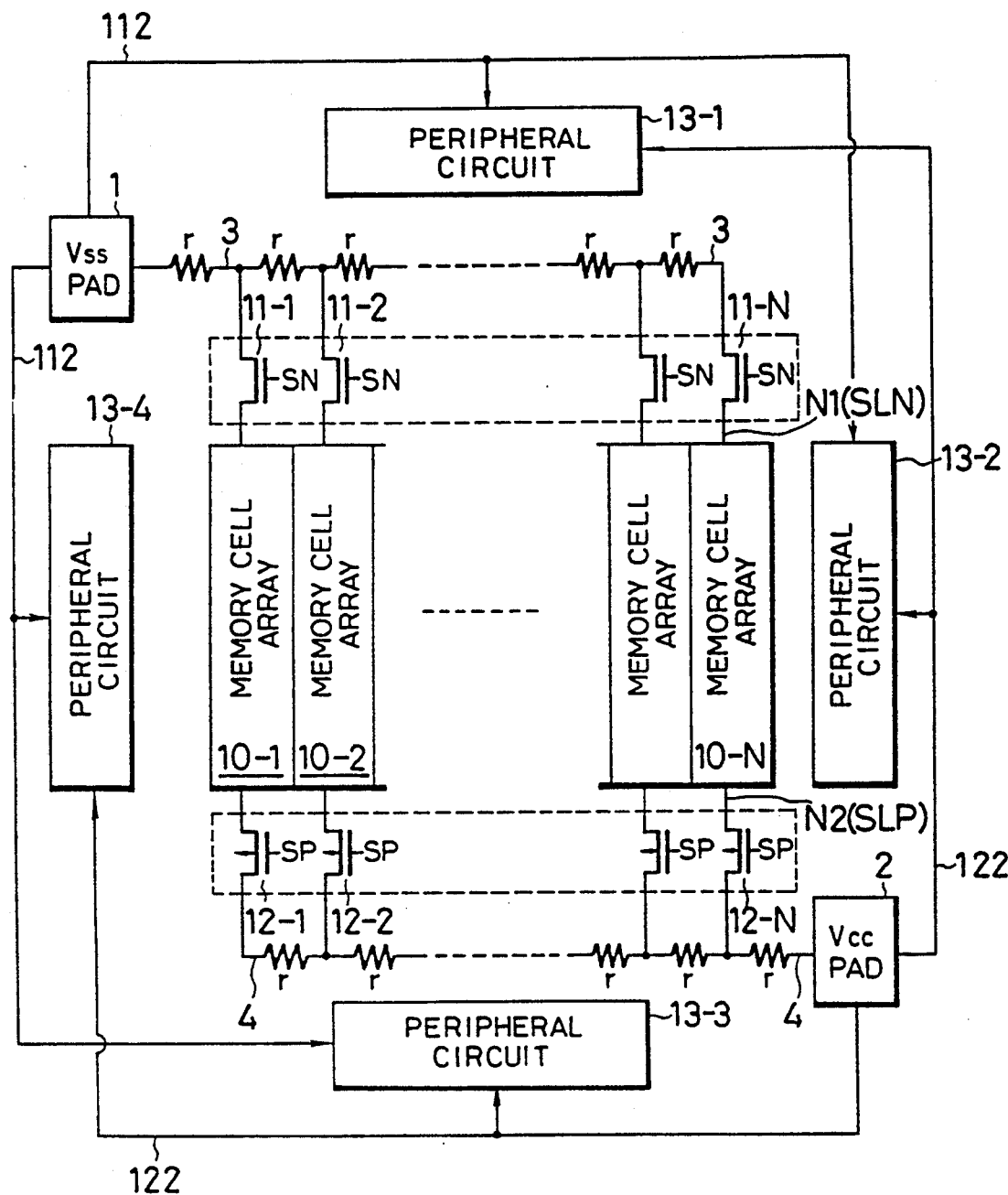
FIG. 2 is a diagram showing the configuration of the semiconductor memory device in the prior art.

In this embodiment, the mutual conductance of the NMOS transistor $164_N$ which is located farthest from Vss pad 160 among the NMOS transistors $164_1$ to $164_N$, is made equal to that of the NMOS transistor (11-N to 11-N) in the prior art of FIG. 2, and as the resistance over the power supply main line 161a is increased, the mutual conductance is varied such that:

$$MN_1 < MN_2 < \ldots < MN_{N-1} < MN_N$$

where $MN_1$ to $MN_N$ respectively represent the mutual conductances of the NMOS transistors $164_1$ to $164_N$. Further, the mutual conductance of the PMOS transistors $174_1$ to $174_N$ is so set that the PMOS transistor $174_1$ located farthest from Vcc pad 170 is made equal to that of the PMOS transistor (12-1 to 12-N) in the prior art of FIG. 2, and as the power supply resistance over the power supply main line 161a is increased, the mutual conductance is varied such that:

$$MP_N < MP_{N-1} < \ldots < MP_2 < MP_1$$

where $MP_N$ to $MP_1$ respectively represent the mutual conductances of the PMOS transistors $174_1$ to $174_N$.

The mutual conductances of the transistors can be adjusted by, for example, varying the gate width.

Like the example of FIG. 8, each of the memory cell arrays $180_1$ to $180_N$ in FIG. 14 is provided with a plurality of word lines $WL_1$ to $WL_Q$, and a plurality of pairs of bit lines $BL_1$, $\overline{BL}_1$ to $BL_p$, $\overline{BL}_p$, and memory cells $70_{11}$ to $70_{PQ}$ connected at their intersections. Connected between the pairs of bit lines $BL_1$, $\overline{BL}_1$ to $BL_p$, $\overline{BL}_p$ are sense amplifiers $60b_1$ to $60b_P$.

Data reading operation of the above semiconductor memory device is similar to described in connection with the earlier described embodiments.

Let us assume, for example that data "1" is stored in the memory cell $70_{11}$ in FIG. 8, and is read from it, the word line $WL_1$ is raised from the low level to the high level by a row decode selection signal $XD_1$. Then the NMOS transistor $70a$ in the memory cell $70_{11}$ is turned on, the data "1" stored in the capacitor $70b$ is transmitted to the bit line $BL_1$ and a slight potential difference is created between the pair of bit lines $BL_1$ and $\overline{BL}_1$. At the same time, data in the memory cells $70_{21}$ to $70_{P1}$ connected to the same word line $WL_1$ are transmitted to the bit lines $BL_2$ to $BL_p$. When the control signal SN of FIG. 14 is raised from the low level to the high level, and at the same time the control signal SP is lowered from the high level to the low level, the NMOS transistors $164_1$ to $164_N$ and the PMOS transistors $174_1$ to $174_N$ are turned on. The common nodes N1 on the side of the sources of the NMOS transistors $164_1$ to $164_N$ are then lowered to the low level, and the common nodes N2 on the sides of the sources of the PMOS transistors $174_1$ to $174_N$ are raised to the high level, and the sense amplifiers $60b_1$ to $60b_P$ are thereby activated.

When the sense amplifiers $60b_1$ to $60b_P$ are activated, the sense amplifier $60b_1$ amplifiers the potential difference between the pair of bit lines $BL_1$ and $\overline{BL}_1$ in FIG. 8. A charging current flows from the power supply line 171 through the sense amplifier $60b_1$ to the bit line $BL_1$, and a discharging current for the bit line $\overline{BL}_1$ flows through the sense amplifier $60b_1$ to the power supply line 161. At the same time, the sense amplifiers $60b_2$ to $60b_P$ amplify the potential differences on the bit line pairs $BL_2$, $\overline{BL}_2$ to $BL_P$, $\overline{BL}_P$, and charging and discharging currents flow to and from these bit lines.

The potential difference between the pair of the bit lines $BL_1$ and $\overline{BL}_1$ amplified by the sense amplifier $60b_1$ is passed through the transfer gate $32_1$ that is selected by the row decode selection signal $YD_1$ to the data bus DB, $\overline{DB}$. Thus, data of the memory cell $70_{11}$ is selectively read.

Figure 15A:
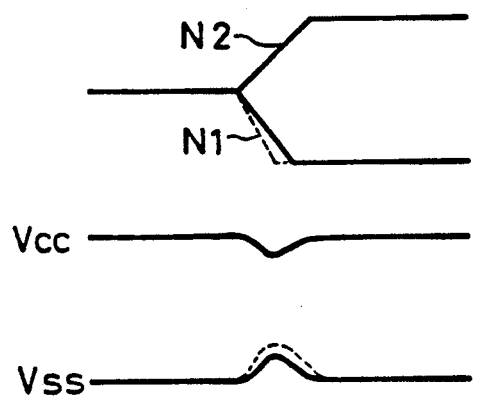
FIG. 15A and FIG. 15B are waveform diagrams for explaining the operation of the semiconductor memory device of FIG. 14 and that of the prior art.
Figure 15B:
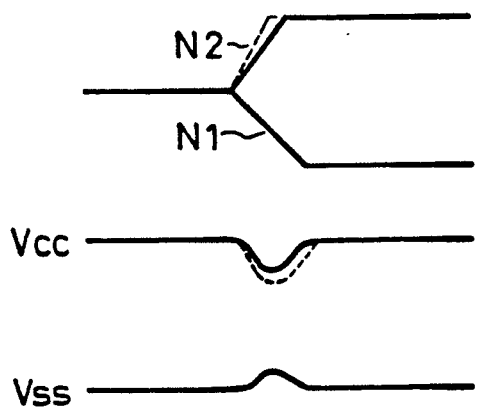

FIG. 15A and FIG. 15B show the waveforms on the sense amplifier activation common nodes N1 and N2, in the vicinities of the power supply pads 160 and 170, for both the present embodiment and in the vicinities of the power supply pads 1 and 2 in the prior art. The solid line shows the waveforms of the present embodiment, and the broken line shows the waveforms of the prior art.

To drive the sense amplifiers in the memory cell arrays $180_1$ to $180_N$, the NMOS transistors $164_1$ to $164_N$ and the PMOS transistors $174_1$ to $174_N$ are turned on to vary the common nodes N1 to the low level and the common nodes N2 to the high level. In the present embodiment, the gate width of the NMOS transistor $164_1$ and the PMOS transistor $174_N$ connected to the location where the resistance over the power supply line 161 or 171 is small, is set equal to or smaller than that of the transistor in the prior art, so the on-resistance is larger and the charging and discharging currents flowing instantly through the NMOS transistor $164_1$ and $174_1$ are reduced. As a result, as shown in FIG. 15A and FIG. 15B, the Vss and Vcc power supply noises can be restrained. Moreover, the noise level during the operation of the memory cell array $180_1$ and the noise level during the operation of the memory cell array $180_N$ are about equal, so the difference in the noise level depending on the memory cell array which is operating can be reduced.

Accordingly, the difference and decline of the operation margin of the peripheral circuit including the input initial-stage connected to other power supply lines 162 and 172 depending on the operating memory cell array ($180_1$ to $180_N$) can be eliminated. Adverse effects such as malfunctions of the peripheral circuits due to the power supply noise can be properly prevented, and the setting of the threshold value in the input initial-stage circuits is facilitated.

Various modifications can be made to the embodiment described above. Examples of the modifications are set forth below.

(a) In the above embodiment, the NMOS transistors $164_1$ to $164_N$ and the PMOS transistors $174_1$ to $174_N$ have varied gate width depending on the resistance of the power supply main lines $161a$ and $171a$. But it is also possible to vary, with the resistance with the power supply line, the mutual conductance by varying other transistor characteristics such as the gate length. Moreover, the NMOS transistors $164_1$ to $164_N$ and the PMOS transistors $174_1$ to $174_N$ may be formed of other transistors with the polarity of the power supply altered.

(b) In FIG. 14, the number of the power supply lines $161a$ and 162, and $171a$ and 172 connected to each power supply pad is 2. But this may be any other number depending on the circuit configuration of the semiconductor memory device. The memory cell arrays $180_1$ to $180_N$ may have configurations other than that shown in FIG. 3. The invention may be applied to static RAM or other types of semiconductor memory devices. Various other modifications are possible.

Merits of the invention are summarized below.

According to the first and second embodiments of FIG. 5 and FIG. 6, the power supply line comprises a main line connected to the power supply, and auxiliary power lines within the respective memory cell arrays, and the main line is disposed along the memory cell arrays, while the auxiliary lines are disposed within the memory cell arrays, and the main line and the auxiliary lines are connected via resistive elements. The resistance of the resistive elements are set higher than the resistance of the main line. It is therefore possible to reduce the difference between the resistances from the power supply to the respective memory cell arrays. The difference in the operation margin between the memory cell arrays due to the difference in the resistance can therefore be reduced, and the setting of the control timing for reading, writing, etc. is facilitated.

According to the third and fourth embodiments of FIG. 7 and FIG. 10, resistive elements and the sense amplifier drive transistors connected in series are provided, so that the charging and discharging currents flowing therethrough when the sense amplifiers conduct can be reduced by virtue of the resistive elements, and the rise or fall in the power supply voltage can be reduced. For this reason, the delay in the access in the operation of the circuit after the sense latch, and reduction in the margin, such as the TTL margin can be prevented.

According to the fifth embodiment of FIG. 12, the switching devices are provided in parallel with the resistive elements. By turning on and off the switching elements responsive to a switching signal, the rapid change in the charging and discharging currents during the sense amplifier operation can be restrained. For this reason, the power supply noise can be reduced, and the reduction in the data transfer speed can be prevented, and the access time can be shortened.

According to the sixth embodiment of FIG. 14, the mutual conductance of the transistor for driving sense amplifiers is set in accordance with the resistance of the power supply line. For example, it is set small at a location were the resistance of the power supply line is small. Accordingly, the noise level in the vicinity of the power supply pad connected to the power supply line at the time of the operation of the sense amplifier can be reduced, and the operation margin in the peripheral circuit including the input initial-stage circuits driven by the same power supply pad can be improved. Moreover, the level of the noise created on the power supply line is uniform regardless of which transistor is operating. As a result, the setting of the threshold value in the input initial-stage circuits which operate on the TTL logic is facilitated.

What is claimed is:

1. A semiconductor memory device comprising a plurality of memory cell arrays in which a potential difference between a pair of bit lines to which memory cells of the arrays are coupled is detected and amplified by a sense amplifier operating responsive to a sense latch signal on a common node, and the memory cells of the arrays are coupled via a power supply line to an output of an internal power supply generating circuit, the internal power supply generating circuit coupled to a power supply pad for connection with an external power supply and for causing a voltage drop, in which:

said power supply line comprises a main line disposed along the plurality of memory cell arrays and a plurality of auxiliary lines, each auxiliary line disposed within each respective memory cell array, the main line having a line resistance; and said main line and each said auxiliary line disposed within each respective memory cell array are coupled to each other via a respective resistive element corresponding to each respective memory cell array, each respective resistive element having a resistance greater than the line resistance of the main line from the power supply to a memory cell array located farthest from the power supply.

2. A semiconductor memory device, comprising:
first, second and third nodes;
a power supply for supplying a first potential;
an internal power supply generating circuit, coupled to the power supply, for providing a second potential to the first node, the second potential being less than the first potential;
a power supply line coupled to the first, second and third nodes, the second node being coupled to the power supply line between where the first and the third nodes are each coupled to the power supply line, the power supply line having a resistance between the first node and the third node;
a first memory cell block including
a first common node,
a first memory cell for storing data therein,
a first sensing amplifier coupled to the first memory cell through a pair of first bit lines for amplifying a difference potential between each bit line of the first pair of bit lines;
a second memory cell block including
a second common node,
a second memory cell for storing data therein,
a second sensing amplifier coupled to the second memory cell through a pair of second bit lines for amplifying a difference potential between each bit line of the second pair of bit lines;
a first resistance element, coupled between the second node and the first common node, having a resistance greater than the resistance of the power supply line; and
a second resistance element coupled between the third node and the second common node, having a resistance substantially equal to the resistance of the first resistance element.

3. A semiconductor memory device comprising:
a plurality of memory cell arrays, each memory cell array including a plurality of memory cells arranged in rows, each respective row of memory cells coupled to a respective pair of bit lines, each respective pair of bit lines coupled to a corresponding sense amplifier, each respective sense amplifier coupled to a first power supply node through a power supply line, each sense amplifier responsive to a respective sense latch signal for detecting and amplifying a potential difference between bit lines of the pair of bit lines coupled to the sense amplifier, the plurality of memory cell arrays arranged to form a row of memory cell arrays;

the power supply line including,
a main line arranged along the row formed by the plurality of memory cell arrays,
a plurality of auxiliary lines, each respective auxiliary line arranged within each respective memory cell array; and
a respective resistive element coupled between each auxiliary line and the main line at respective locations along the main line,
wherein, the main line includes a first line resistance between the first power supply node and a first location where a resistive element is coupled to the main power line and a second line resistance between each subsequent location where a resistive element is coupled to the main line, each respective resistive element coupled to the main line having a resistance such that the resistance of the respective resistive element plus the first line resistance of the main line the second line resistance between the location where the respective resistive element is coupled to the main line and the first location equals a predetermined value of resistance.

4. The semiconductor memory device according to claim 3, further comprising an internal power supply generating circuit coupled between the first power supply node and a external power supply for causing a voltage drop.

* * * * *